United States Patent
Kaku et al.

(10) Patent No.: US 8,116,152 B2
(45) Date of Patent: Feb. 14, 2012

(54) NONVOLATILE SEMICONDUCTOR MEMORY DEVICE CAPABLE OF PREVENTING WRITE-DISTURB AND METHOD OF PROGRAMMING

(75) Inventors: Daichi Kaku, Kanagawa-ken (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/685,939

(22) Filed: Jan. 12, 2010

(65) Prior Publication Data

US 2010/0182858 A1    Jul. 22, 2010

(30) Foreign Application Priority Data

Jan. 16, 2009  (JP) .................. 2009-008145

(51) Int. Cl.
*G11C 17/16* (2006.01)
(52) U.S. Cl. .............. 365/189.16; 365/225.7; 365/203; 365/194; 365/230.02
(58) Field of Classification Search ........... 365/96, 365/225.7, 203, 194, 230.02, 189.16
See application file for complete search history.

(56) References Cited

U.S. PATENT DOCUMENTS

| 5,208,780 A | * | 5/1993 | Iwase et al. | 365/225.7 |
| 6,741,117 B2 | * | 5/2004 | Lee | 327/525 |
| 7,505,300 B2 | | 3/2009 | Namekawa | |
| 2006/0133127 A1 | * | 6/2006 | Nakano et al. | 365/96 |

FOREIGN PATENT DOCUMENTS

JP    2008-171477    7/2008

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A nonvolatile semiconductor memory device includes a memory cell, a precharge control circuit, a power supply circuit, a bit line driver, a word line driver, a first multiplexer, and a second multiplexer. The memory cell includes an anti-fuse storage element and a selection transistor. Before data are written into the anti-fuse storage element of the memory cell, the anti-fuse storage element is set up in a precharged state by the precharge control circuit, the bit line driver, the word line driver, the first multiplexer, and the second multiplexer.

14 Claims, 8 Drawing Sheets

NONVOLATILE SEMICONDUCTOR MEMORY DEVICE CAPABLE OF PREVENTING WRITE-DISTURB AND METHOD OF PROGRAMMING

CROSS REFERENCE TO RELATED APPLICATION

This application is based upon and claims the benefit of priority from the prior Japanese Patent Application No. P2009-8145, filed on Jan. 16, 2009, the entire contents of which are incorporated herein by reference.

FIELD OF THE INVENTION

The invention relates to an electrically readable and writable nonvolatile semiconductor memory device, and to a method of programming for the same.

DESCRIPTION OF THE BACKGROUND

In a semiconductor integrated circuit (LSI), a relatively small-type nonvolatile semiconductor memory device is required, which can be embedded together with other elements in a single chip and which is capable of retaining stored data even after a power supply is cut off. The embedded-type nonvolatile semiconductor memory devices are used for a various purposes such as providing redundancy for large-capacity memories including dynamic random access memories (DRAMs) and static random access memories (SRAMs), storing codes including cryptographic keys managing manufacturing history, or tuning analog circuits. Conventionally, laser fuses have been used as memory elements for nonvolatile semiconductor memory devices used for the above-mentioned purposes. A laser fuse needs a special fuse blowing apparatus and a process associated with the special fuse blowing apparatus. In addition, laser fuses are difficult to miniaturize. Using laser fuses results in increase in the proportion of the area occupied by each laser fuse in the chip. Such a problem of the higher occupancy of laser fuses encourages development of anti-fuse storage elements having a MOS structure, for example, to replace the laser fuses. An anti-fuse storage element is disclosed in Japanese Patent Application Publication No. 2008-171477.

In a memory that employs MOS-structure anti-fuse storage elements, an erroneous writing may occur in a MOS-structure anti-fuse storage element. Such a write an erroneous writing is a write disturb fault. To avoid occurrence of the write disturb fault, each memory cell is provided with two ports. Consequently, the number of elements and the number of signals increase in the memory cell. Such increases result in a problem that the memory cells occupy a larger area.

SUMMARY OF THE INVENTION

According to an aspect of the invention is provided a nonvolatile semiconductor memory device, comprising a memory cell including an anti-fuse storage element and a selection transistor, a first terminal of the selection transistor being connected to one end of the anti-fuse storage element, a control terminal of the selection transistor being connected to a word line, and a second terminal of the selection transistor being connected to a bit line, a precharge control circuit to receive an input of a write enable signal and to generate a bit line control signal, a word line control signal, a write permission signal and a first control signal in response to the write enable signal, a power supply circuit to receive an input of the write permission signal and to supply a write voltage to the other end of the anti-fuse element in response to the write permission signal, a bit line potential control unit to receive inputs of an address control signal, the bit line control signal and the first control signal, and to control the potential of the bit line in response to the address control signal, the bit line control signal and the first control signal and a word line potential control unit to receive inputs of the address control signal, the word line control signal and the first control signal, and to control the potential of the word line in response to the address control signal, the word line control signal and the first control signal, wherein before a write operation of the anti-fuse storage element is executed, the potential of the one end of the anti-fuse storage element is raised, so that the anti-fuse storage element is set to be in a precharged state.

According to another aspect of the invention is provided a nonvolatile semiconductor memory device, comprising a memory cell array including a plurality of memory cells arranged in a matrix form, each memory cell including an anti-fuse storage element and a selection transistor, a first terminal of the selection transistor being connected to one end of the anti-fuse storage element, a control terminal of the selection transistor being connected to a word line, and a second terminal of the selection transistor being connected to a bit line, a precharge control circuit to receive an input of a write enable signal and to generate a bit line control signal, a word line control signal, a write permission signal and a first control signal in response to the write enable signal, a power supply circuit to receive an input of the write permission signal and to supply a write voltage to the other end of the anti-fuse element in response to the write permission signal, a bit line potential control unit to receive inputs of a first address control signal outputted from a bit line control circuit, the bit line control signal and the first control signal, and to control the potential of the bit line in response to the first address control signal, the bit line control signal and the first control signal and a word line potential control unit to receive inputs of a second address control signal outputted from a word line control circuit, the word line control signal and the first control signal, and to control the potential of the word line in response to the second address control signal, the word line control signal and the first control signal, wherein before a write operation of the anti-fuse storage element is executed, the potential of the one end of the anti-fuse storage element is raised, so that the anti-fuse storage element is set to be in a precharged state.

According to further another aspect of the invention is provided a method of programming for a nonvolatile semiconductor memory device including, a memory cell having an anti-fuse storage element and a selection transistor, a power supply circuit, a bit line potential control unit and a word line potential control unit, a first terminal of the selection transistor being connected to one end of the anti-fuse storage element, a control terminal of the selection transistor being connected to a word line, and a second terminal of the selection transistor being connected to a bit line, the method comprising, setting the bit line at a first high potential by the bit line potential control unit, raising the potential of the word line up to a second high potential by the word line potential control unit so as to activate the word line, to setting the anti-fuse storage element in a precharged state, lowering the potential of the word line by the word line potential control unit so as to deactivate the word line, to keep the precharged state of the anti-fuse storage element and supplying a write voltage outputted from the power supply circuit to the other end of the anti-fuse storage element after the deactivation of the word line, so that data is written into the anti-fuse storage element.

DETAILED DESCRIPTION OF THE INVENTION

Figure 1:
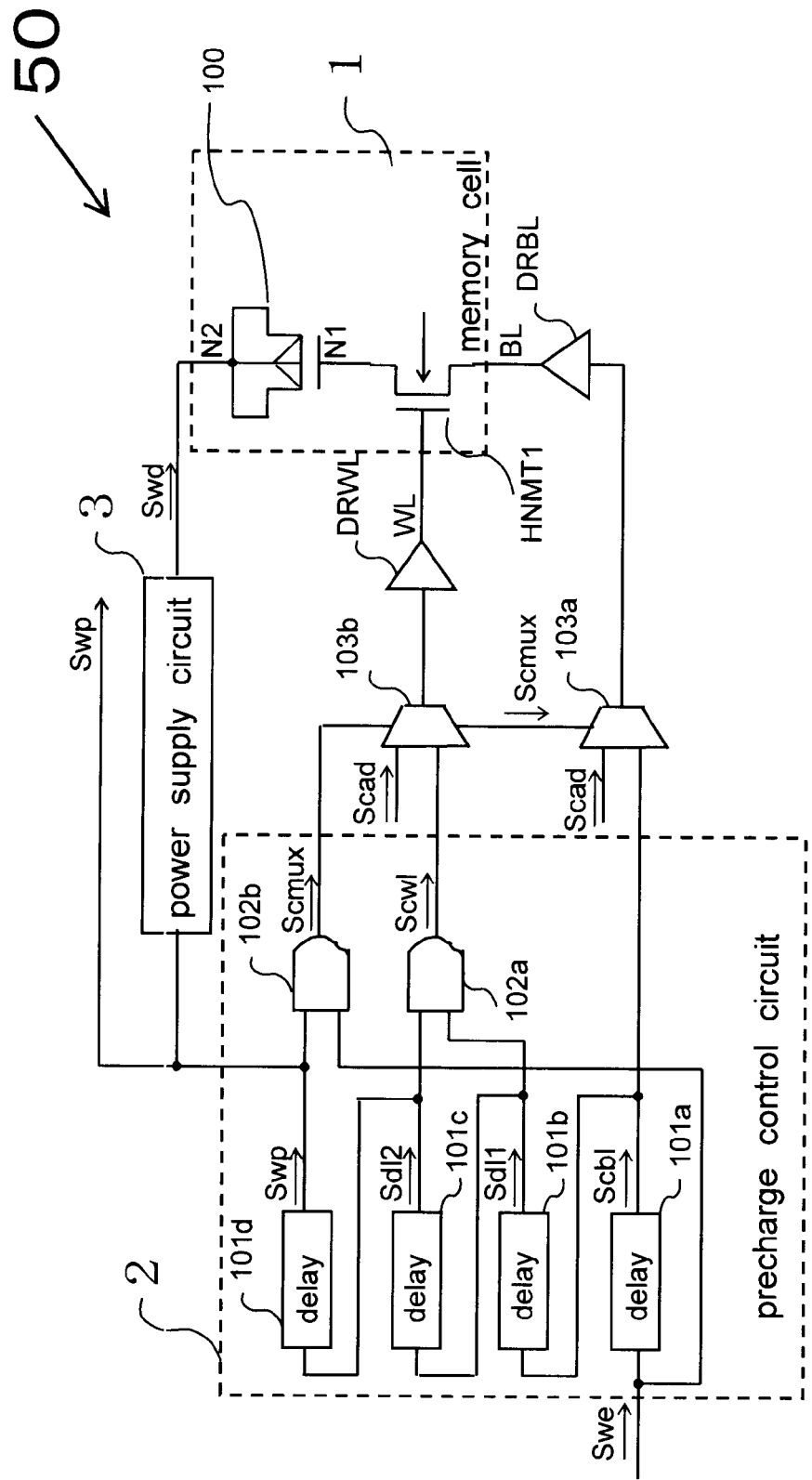
FIG. 1 is a circuit diagram illustrating a nonvolatile semiconductor memory device according to a first embodiment of the invention.

Hereinafter, embodiments of the invention will be described by referring to the drawings.

Figure 2:
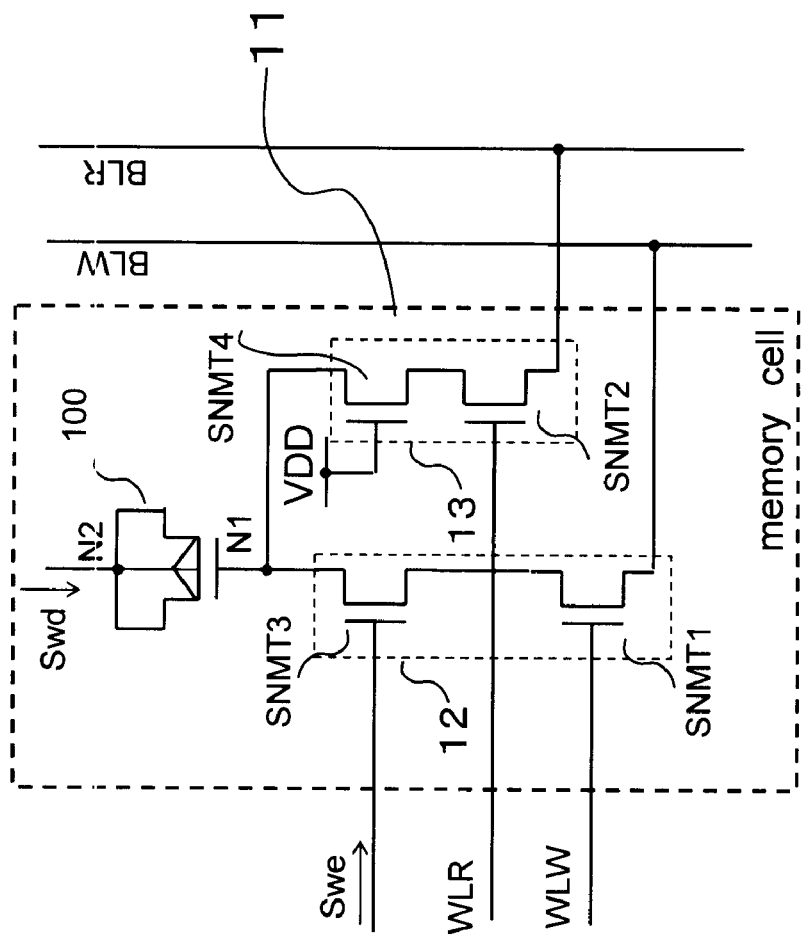
FIG. 2 is a circuit diagram illustrating a nonvolatile semiconductor memory device according to a comparative example of a first embodiment of the invention.

A nonvolatile semiconductor memory device and its programming method according to a first embodiment of the invention will be described below by referring to the drawings. FIG. 1 is a circuit diagram illustrating a nonvolatile semiconductor memory device of the first embodiment. FIG. 2 is a circuit diagram illustrating a nonvolatile semiconductor memory device of a comparative example. In the first embodiment, a precharge operation of an anti-fuse storage element is set up before a write operation of the anti-fuse storage element is executed.

As FIG. 1 shows, a nonvolatile semiconductor memory device 50 includes a memory cell 1, a precharge control circuit 2, a power supply circuit 3, a bit line driver DRBL, a word line driver DRWL, a multiplexer 103a, and a multiplexer 103b. The nonvolatile semiconductor memory device 50 has low redundancy, but has a fast operation speed. The nonvolatile semiconductor memory device 50 is used for a wide variety of purposes such as: providing redundancy for large-capacity memories including dynamic random access memories (DRAMs) and static random access memories (SRAMs); storing codes including cryptographic keys; managing manufacturing history; and tuning analog circuits. In addition, the memory cell 1 is used for a field programmable gate array (FPGA) or the like.

The memory cell 1 includes an anti-fuse storage element 100 and a selection transistor HNMT1. The memory cell 1 serves as an anti-fuse memory cell.

In the anti-fuse storage element 100, the source, the drain, and the body (also known as the "back gate") are connected to a node N2, whereas the gate is connected to a node N1. The input into the Node N2 is a write signal Swd outputted from the power supply circuit 3. The node N1 is connected to one of the source and the drain (first terminal) of the selection transistor HNMT1. The power supply circuit 3 is used as the power supply for the writing of the anti-fuse storage element 100. The anti-fuse storage element 100 includes a P-channel MOS transistor. The anti-fuse storage element 100 stores data having a value "0" before the breaking of the fuse, and stores data having a value "1" after the breaking of the fuse.

One of the source and the drain (first terminal) of the selection transistor HNMT1 is connected to the anti-fuse storage element 100. The gate (control terminal) of the selection transistor HNMT1 is connected to a word line WL. The other of the source and the drain (second terminal) of the selection transistor HNMT1 is connected to a bit line BL. The selection transistor HNMT1 includes an N-channel MOS transistor. The breakdown voltages (i.e., a breakdown voltage for the gate and a breakdown voltage between the source and the drain) of the selection transistor HNMT1 are higher than the corresponding breakdown voltages of each of the transistors included in, for example, the precharge control circuit 2, the bit line driver DRBL, the word line driver DRWL, the multiplexer 103a, and the multiplexer 103b.

At the time of the write operation, the other of the source and the drain (the second terminal) on the bit line side of the selection transistor HNMT1 is set at a lower voltage source voltage (specifically, the ground potential) VSS. In the other occasions, the other of the source and the drain (the second terminal) on the bit line side of the selection transistor HNMT1 is set at a higher voltage source voltage VDD. At the time of writing data having a value "1", the gate (control terminal) on the word line WL is set at the higher voltage source voltage VDD. At the time of writing data having a value "0", the gate (control terminal) on the word line (WL) is set at the lower voltage source voltage (ground potential) VSS.

The precharge control circuit 2 includes delay circuits 101a to 101d, a two-input AND circuit 102a, and a two-input AND circuit 102b. The precharge control circuit 2 generates a signal that turns the memory cell 1 into a precharged state before the write operation of the memory cell 1.

A write-enable signal Swe is inputted into the delay circuit 101a. The delay circuit 101a delays the write-enable signal Swe by a first delay time, and outputs the resultant signal as a bit line control signal Scbl. The delay circuit 101a serves as a first delay unit.

The bit line control signal Scbl outputted from the delay circuit 101a is inputted into the delay circuit 101b. The delay circuit 101b delays the bit line control signal Scbl by a second delay time, and outputs the resultant signal as a delay signal Sdl1. The delay circuit 101b serves as a second delay unit.

The delay signal Sdl1 outputted from the delay circuit 101b is inputted into the delay circuit 101c. The delay circuit 101c delays the delay signal Sdl1 by a third delay time, and outputs the resultant signal as a delay signal Sdl2. The delay circuit 101c serves as a third delay unit.

The delay signal Sdl2 outputted from the delay circuit 101c is inputted into the delay circuit 101d. The delay circuit 101d delays the delay signal Sdl2 by a fourth delay time, and outputs the resultant signal as a write permission signal Swp. The delay circuit 101d serves as a fourth delay unit.

Each of the delay circuits 101a to 101d is configured of inverters in an even number of stages. Alternatively, each of the delay circuits 101a to 101d may be configured of buffers in plural stages. In addition, the delay circuits 101a to 101d are used as the delay units, but instead, such delay elements as resisters and capacitors may be used as the delay units.

The two-input AND circuit 102a receives an input of the delay signal Sdl1 outputted from the delay circuit 101b and an input of the delay signal Sdl2 outputted from the delay circuit 101c. The two-input AND circuit 102a executes a logical operation with these inputs, and outputs the resultant signal as a word line control signal Scwl.

The two-input AND circuit 102b receives an input of the write enable signal Swe and an input of the write permission signal Swp outputted from the delay circuit 101d. The two-input AND circuit 102b executes a logical operation with these inputs, and outputs the resultant signal as a multiplexer control signal Scmux.

Here, the two-input AND circuits 102a and 102b are used. Alternatively, they may be replaced by other types of logic circuits to form the logic configuration.

The multiplexer 103a receives an input of the bit line control signal Scbl outputted from the delay circuit 101a and an input of an address control signal Scad. In response to the multiplexer control signal Scmux outputted from the two-input AND circuit 102b, the multiplexer 103a outputs, selectively, one of the bit line control signal Scbl and the address control signal Scad. The signal outputted from the multiplexer 103a is then inputted into the bit line driver DRBL, which drives this inputted signal and outputs the signal into the bit line BL.

The multiplexer 103b receives an input of the word line control signal Scwl outputted from the two-input AND circuit 102a and an input of an address control signal Scad. In response to the multiplexer control signal Scmux outputted from the two-input AND circuit 102b, the multiplexer 103b outputs, selectively, one of the word line control signal Scwl and the address control signal Scad. The signal outputted from the multiplexer 103b is then inputted into the word line driver DRWL, which drives this inputted signal and outputs the signal into the word line WL.

Here, the multiplexer 103a and the bit line driver DRBL serve as a bit line potential control unit. The multiplexer 103b and the word line driver DRWL serve as a word line potential control unit.

The power supply circuit 3 receives an input of the write permission signal Swp outputted from the delay circuit 101d. When the write operation of memory cell 1 is executed, the power supply circuit 3 outputs the write signal Swd that has a higher potential than the higher voltage source voltage VDD to the anti-fuse storage element 100 (i.e., the node N2) of the memory cell 1.

FIG. 2 shows that in the nonvolatile semiconductor memory device of the comparative example, a memory cell 11 has a two-port configuration so as to prevent write disturb fault from occurring. The memory cell 11 includes an anti-fuse storage element 100, a write port 12, and a read port 13.

In the anti-fuse storage element 100, a write signal Swd is input into the source, the drain and the body (i.e., into the node N2 side). The gate (i.e., the node N1 side) of the anti-fuse storage element 100 is connected to the write port 12 and the read port 13.

The write port 12 includes a control transistor SNMT1 and another control transistor SNMT3.

One of the source and the drain of the control transistor SNMT3 is connected to the gate (i.e., the node N1) of the anti-fuse storage element 100. A write enable signal Swe is inputted into the gate of the control transistor SNMT3. One of the source and the drain of the control transistor SNMT1 is connected to the other of the source and the drain of the control transistor SNMT3. The gate of the control transistor SNMT1 is connected to a write word line WLW. The other of the source and the drain of the control transistor SNMT1 is connected to a write bit line BLW.

The read port 13 includes a control transistor SNMT2 and another control transistor SNMT4.

One of the source and the drain of the control transistor SNMT4 is connected to the gate (i.e., the node N1) of the anti-fuse storage element 100. The gate of the control transistor SNMT4 is connected to the higher voltage source voltage VDD. One of the source and the drain of the control transistor SNMT2 is connected to the other of the source and the drain of the control transistor SNMT4. The gate of the control transistor SNMT2 is connected to a read word line WLR. The other of the source and the drain of the control transistor SNMT2 is connected to a read bit line BLR. Note that neither the description nor the drawing of the write operation and the read operation will be provided for the comparative example.

Figure 3:
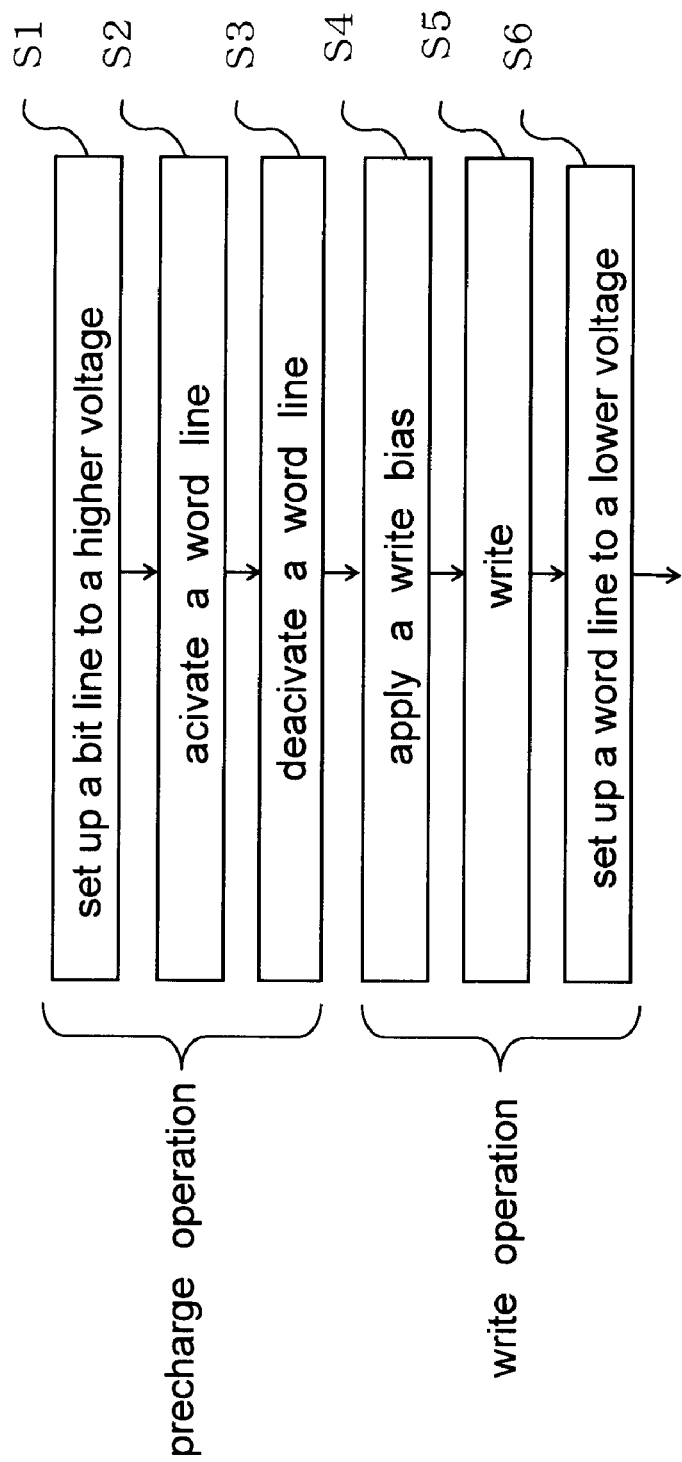
FIG. 3 is a flowchart illustrating a precharge operation and a write operation of the nonvolatile semiconductor memory device according to the first embodiment of the invention.
Figure 4:
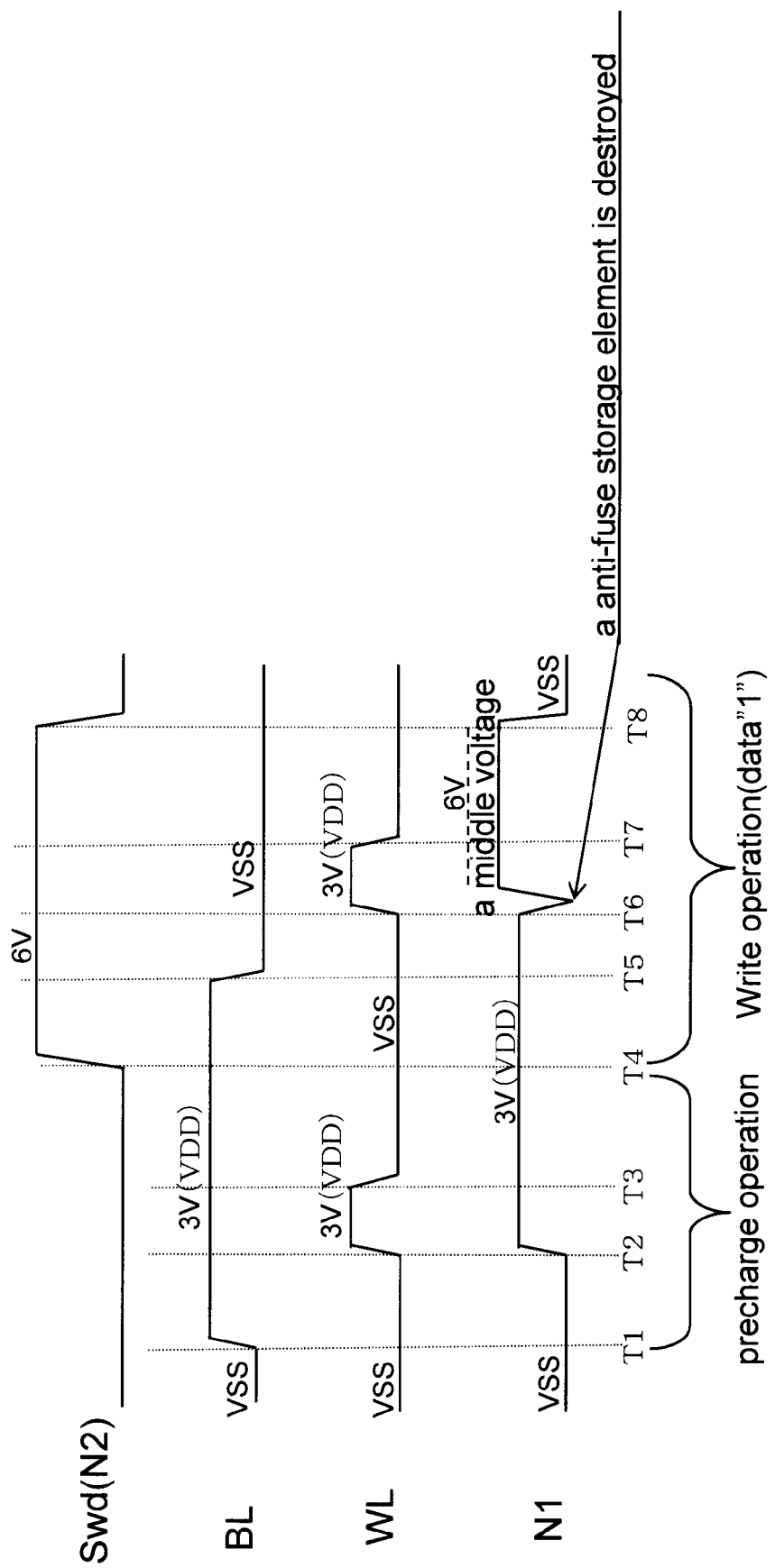
FIG. 4 is a timing chart illustrating the precharge operation and the write operation of the nonvolatile semiconductor memory device according to the first embodiment of the invention.

Subsequently, the precharge operation and the write operation of the nonvolatile semiconductor memory device will be described by referring to FIGS. 3 and 4. FIG. 3 is a flowchart illustrating a precharge operation and a write operation of the nonvolatile semiconductor memory device. FIG. 4 is a timing chart illustrating the precharge operation and the write operation of the nonvolatile semiconductor memory device. Here, the data having a value "1" represents the write operation.

FIGS. 3 and 4 show that in the nonvolatile semiconductor memory device 50, the write signal Swd, the bit line BL, and the word line WL are set at the lower voltage source voltage (ground potential) VSS before the precharge operation is executed.

Next, at a time T1, the voltage of the bit line BL is raised from the lower voltage source voltage (ground potential) VSS up to the higher voltage source voltage VDD, for example, up to 3V (step S1).

Subsequently, at a time T2, the voltage of the word line WL is raised from the lower voltage source voltage (ground potential) VSS up to the higher voltage source voltage VDD. When the voltage of the word line WL reaches the higher voltage source voltage VDD (i.e., when the word line WL is activated), the selection transistor HNMT1 is turned ON. The voltage of one of the source and the drain of the selection transistor HNMT1 (i.e., the gate (the node N1) of the anti-fuse storage element 100) is raised from the lower voltage source voltage (ground potential) VSS up to the higher voltage source voltage VDD. Thus, the precharge of the anti-fuse storage element 100 is executed (step S2).

Then, at a time T3, the voltage of the word line WL is lowered from the higher voltage source voltage VDD down to the lower voltage source voltage (ground potential) VSS, so that the word line WL is deactivated. The anti-fuse storage element 100 is kept in the precharged state. Note that the period of precharge operation starts from the time T1 and ends immediately before a time T4 when the voltage of the write signal Swd is raised up (step S3).

Next, at the time T4, the voltage of the write signal Swd is raised from the lower voltage source voltage (ground potential) VSS up to a voltage that is higher than the higher voltage source voltage VDD (3V); for example, the voltage of the write signal Swd may be raised up to 6V (application of the voltage for writing). Here, the node N2 of the anti-fuse storage element 100 is at 6V. The node N1 of the anti-fuse storage element 100 is at 3V. This means that the potential difference between the node N2 and the node N1 is 3V. Accordingly, no electrical breakdown of the anti-fuse storage element 100 takes place at this moment (step S4).

Subsequently, at a time T5, the voltage of the bit line BL is lowered from the higher voltage source voltage VDD down to the lower voltage source voltage (ground potential) VSS, so that the bit line BL is deactivated. After that, at a time T6, the voltage of the word line WL is raised from the lower voltage source voltage (ground potential) VSS up to the higher voltage source voltage VDD. Accordingly, the anti-fuse storage element 100 is turned ON. The voltage of one of the source and the drain of the selection transistor HNMT1 (the gate (the node N1) of the anti-fuse storage element 100) is lowered down. The potential difference between the node N2 and the node N1 increases, resulting in the electrical breakdown of the anti-fuse storage element 100. Consequently, data having a value "1" is written in the anti-fuse storage element 100 (step S5).

Then, at a time T7, the voltage of the word line WL is lowered from the higher voltage source voltage VDD down to the lower voltage source voltage (ground potential) VSS, so that the selection transistor HNMT1 is turned OFF. Consequently, the voltage of the node N1 is uppered from the lower voltage source voltage (ground potential) VSS up to the middle voltage between the voltage (6V) for writing and the lower voltage source voltage (ground potential) VSS. After that, at a time T8, the voltage of the write signal Swd is lowered from 6V down to the lower voltage source voltage (ground potential) VSS, and one of the source and the drain of the selection transistor HNMT1 (i.e., the gate (the node N1) of the anti-fuse storage element 100) is set up at the lower voltage source voltage (ground potential) VSS. Note that the period of write operation starts from the time T4 and ends at the time T8 (step S6).

As has been described thus far, the nonvolatile semiconductor memory device, which the first embodiment of the invention provides together with its programming method, includes the memory cell 1, the precharge control circuit 2, the power supply circuit 3, the bit line driver DRBL, the word line driver DRWL, the multiplexer 103a, and the multiplexer 103b. The memory cell 1 includes the anti-fuse storage element 100 and the selection transistor HNMT1. The precharge control circuit 2 includes the delay circuits 101a to 101d, two-input AND circuit 102a, and two-input AND circuit 102b. The precharge control circuit 2 receives an input of the write enable signal Swe, and generates the bit line control signal Scbl, the word line control signal Scwl, the multiplexer control signal Scmux, and the write permission signal Swp. Before the data are written into the anti-fuse storage element 100 of the memory cell 1, the anti-fuse storage element 100 is set up in the precharged state by the precharge control circuit 2, the bit line driver DRBL, the word line driver DRWL, the multiplexer 103a, and the multiplexer 103b. After the anti-fuse storage element of each memory cell, which is either a writing target or a non-writing target, is set up in the precharged state, the power supply circuit 3 outputs the write signal Swd that has a higher potential than the higher voltage source voltage VDD, and the write signal Swd is supplied to the anti-fuse storage element 100.

Accordingly, during the write operation, no large potential difference occurs between the two ends of the anti-fuse storage element 100 of each memory cell that is the non-writing target. Consequently, the write-disturb fault can be prevented from occurring. In addition, each memory cell 1 includes the anti-fuse storage element 100 and the selection transistor HNMT1, and thus the number of elements and the number of signals in the memory cell 1 are reduced significantly. Accordingly, even if the nonvolatile semiconductor memory device 50 is highly integrated, the increase in the area occupied by the memory cell can be reduced significantly.

Note that the nonvolatile semiconductor memory device 50 of the first embodiment is made of MOS transistors, but MIS transistors may be used in place of the MOS transistors. Incidentally, both the MOS transistors and the MIS transistors are known as the insulated gate field effect transistors.

Figure 5:
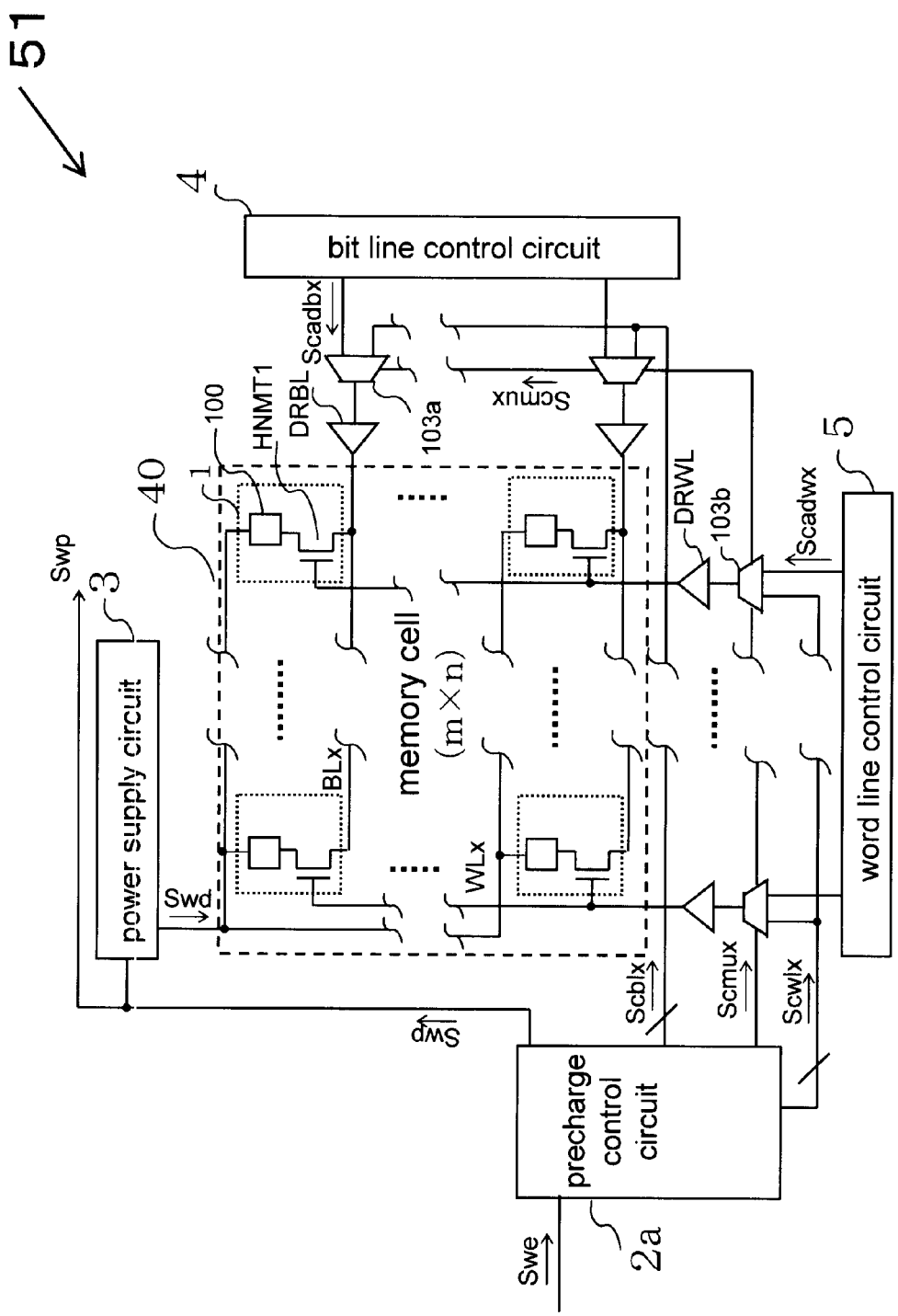
FIG. 5 is a circuit diagram illustrating a nonvolatile semiconductor memory device according to a second embodiment of the invention.

A nonvolatile semiconductor memory device and its programming method according to a second embodiment of the invention will be described below by referring to the drawings. FIG. 5 is a circuit diagram illustrating a nonvolatile semiconductor memory device. In the second embodiment, memory cells each including an anti-fuse storage element and selection transistor are arranged in a matrix, and a precharge operation of each anti-fuse storage element is set up before a write operation of the anti-fuse storage element is executed.

As FIG. 5 shows, a nonvolatile semiconductor memory device 51 includes a memory cell array 40, a precharge control circuit 2a, a power supply circuit 3, a bit line control circuit 4, a word line control circuit 5, plural bit line drivers DRBL, plural word line drivers DRWL, plural multiplexers 103a, and plural multiplexers 103b. In the memory cell array 40 of the nonvolatile semiconductor memory device 51, m memory cells 1 are arranged in the word line WL direction, and n memory cells 1 are arranged in the bit line BL direction. So, the memory cell array 40 of the nonvolatile semiconductor memory device 51 is formed by arranging the memory cells 1 in an (m×n) matrix.

The memory cell 1 includes an anti-fuse storage element 100 and a selection transistor HNMT1 (a similar structure to the memory cell of the first embodiment). One end of the anti-fuse storage element 100 receives an input of a write signal Swd outputted from the power supply circuit 3. The other end of the anti-fuse storage element 100 is connected to one of the source and the drain of the selection transistor HNMT1. The gate of the selection transistor HNMT1 is connected to word lines WLx. The other one of the source and the drain is connected to bit lines BLx.

The precharge control circuit 2a has a similar structure to the structure of the precharge control circuit 2 of the first embodiment (except that the precharge control circuit 2a outputs more lines of signals). The precharge control circuit 2a receives an input of a write enable signal Swe. In response to the write enable signal Swe, the precharge control circuit 2a outputs word line control signals Scwlx corresponding respectively to m word lines WLx, bit line control signals Scblx corresponding respectively to n bit lines BLx, a write permission signal Swp, and a multiplexer control signal Scmux.

The power supply circuit 3 receives an input of the write permission signal Spw outputted from the precharge control circuit 2a. At the time of a writing operation of the (m×n) memory cells 1 provided in the memory cell array 40, the power supply circuit 3 outputs a write signal Swd, which has a higher potential than the higher voltage source voltage VDD, to the anti-fuse storage element 100 of the memory cell 1.

The bit line control circuit 4 generates address control signals Scadbx that control individually the addresses of the n bit lines BLx. The bit line control circuit 4 outputs the address control signals Scadbx to the multiplexers 103a corresponding respectively to the n bit lines BLx.

The n multiplexers 103a are placed so as to be opposed to the bit line control circuit 4. Each multiplexer 103a receives an input of the bit line control signal Scblx outputted from the precharge control circuit 2a and an input of the address control signal Scadbx outputted from the bit line control circuit 4. In response to the multiplexer control signal Scmux outputted from the precharge control circuit 2a, each of the n multiplexers 103a outputs, selectively, either the bit line control signal Scblx or the address control signal Scadbx.

The n bit line drivers DRBL are placed so as to be opposed to the bit line control circuit 4 and opposed respectively to the multiplexers 103a. Each of the n bit line drivers DRBL receives an input of the signal outputted from the corresponding multiplexer 103a. Each bit line driver DRBL drives the signal thus inputted and outputs the signal to the corresponding bit line BLx.

The word line control circuit 5 generates address control signals Scadwx that control individually the addresses of the m word lines WLx. The word line control circuit 5 outputs the address control signals Scadwx to the multiplexers 103b corresponding respectively to the m word lines WLx.

The m multiplexers 103b are placed so as to be opposed to the word line control circuit 5. Each multiplexer 103b receives an input of the word line control signal Scwlx outputted from the precharge control circuit 2a and an input of the address control signal Scadwx outputted from the word line control circuit 5. In response to the multiplexer control signal Scmux outputted from the precharge control circuit 2a, each of the m multiplexers 103b outputs, selectively, either the word line control signal Scwlx or the address control signal Scadwx.

The m word line drivers DRWL are placed so as to be opposed to the word line control circuit 5 and opposed respectively to the multiplexers 103b. Each of the m word line drivers DRWL receives an input of the signal outputted from the corresponding multiplexer 103b. Each bit line driver DRWL drives the signal thus inputted and outputs the signal to the corresponding word line WLx.

Here, the multiplexer 103a and the bit line driver DRBL serve as a bit line potential control unit. The multiplexer 103b and the word line driver DRWL in the second embodiment serve as a word line potential control unit.

The power supply circuit 3 receives an input of the write permission signal Swp outputted from the precharge control circuit 2a. When the write operation of (m×n) memory cells 1 provided in the memory cell array 40 is executed, the power supply circuit 3 outputs the write signal Swd that has a higher potential than the higher voltage source voltage VDD to the anti-fuse storage elements 100 of the memory cells 1.

Figure 6:
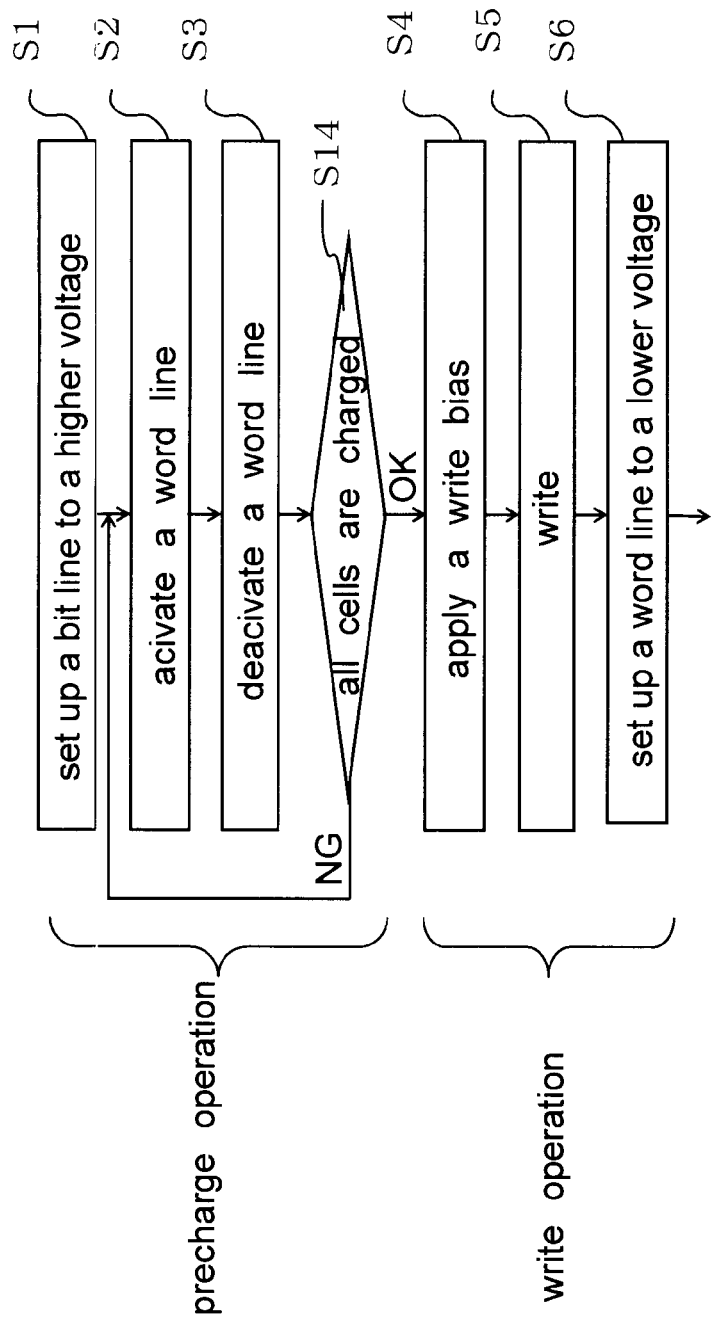
FIG. 6 is a flowchart illustrating a precharge operation and a write operation of the nonvolatile semiconductor memory device according to the second embodiment of the invention.
Figure 7:
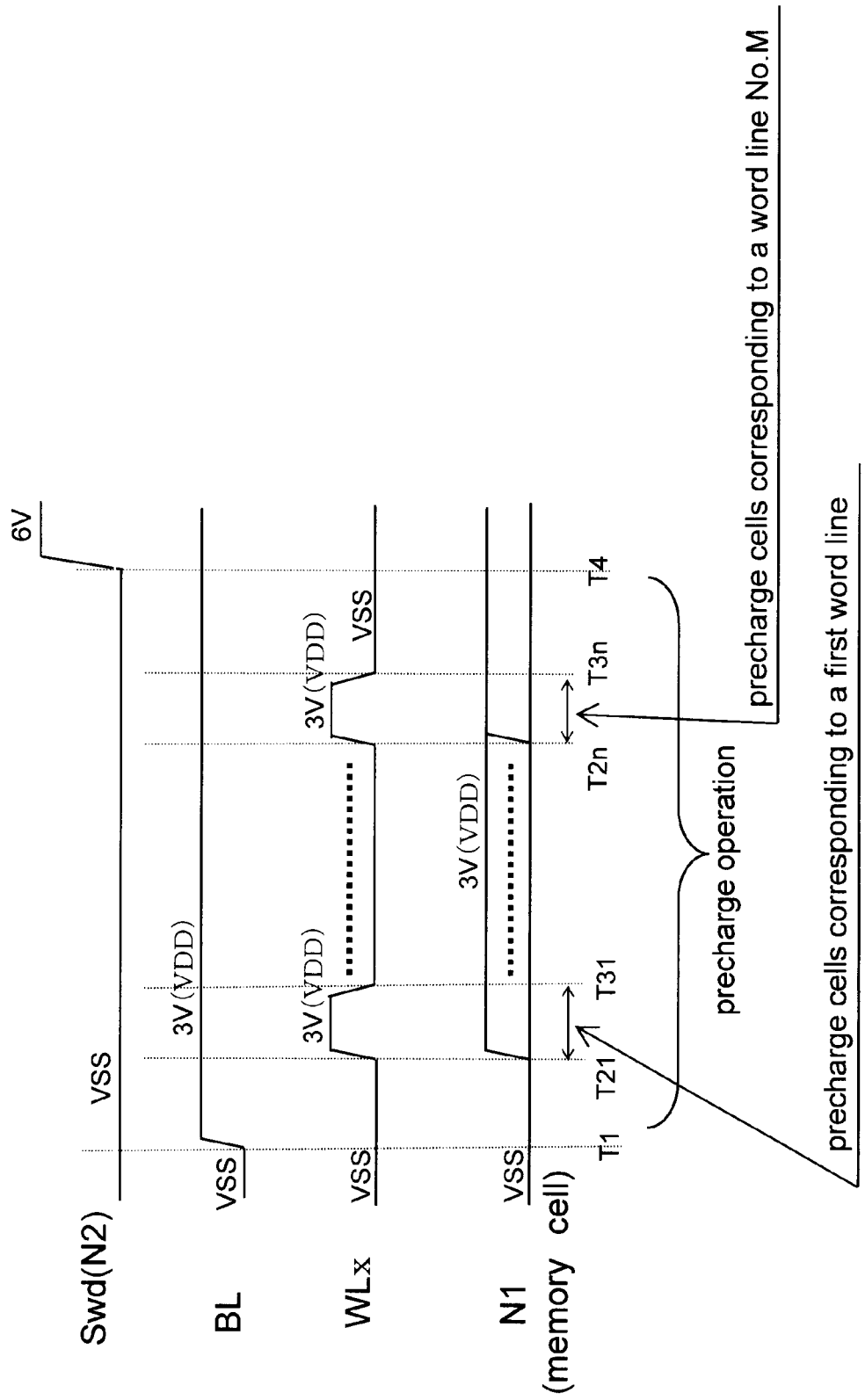
FIG. 7 is a timing chart illustrating the precharge operation and the write operation of the nonvolatile semiconductor memory device according to the second embodiment of the invention.

Next, the precharge operation and the write operation of the nonvolatile semiconductor memory device will be described by referring to FIGS. 6 and 7. FIG. 6 is a flowchart illustrating a precharge operation and a write operation of the nonvolatile semiconductor memory device. FIG. 7 is a timing chart illustrating the precharge operation and the write operation of the nonvolatile semiconductor memory device.

FIGS. 6 and 7 show that in the nonvolatile semiconductor memory device 51, the write signal Swd, the bit lines BL, and the word lines WL are set at the lower voltage source voltage (ground potential) VSS before the precharge operation is executed.

Then, at a time T1, the voltage of each bit line BL (each of all the bit lines BLx) is raised from the lower voltage source voltage (ground potential) VSS up to the higher voltage source voltage VDD, for example, up to 3V (step S1).

Subsequently, at a time T21, the voltage of, for example, the first one of all the word lines WLx is raised from the lower voltage source voltage (ground potential) VSS up to the higher voltage source voltage VDD. When the voltage of the first word line WLx reaches the higher voltage source voltage VDD (i.e., when the word line WL is activated), the selection transistors HNMT1 of the n memory cells 1 connected to the first word line WLx are turned ON. The voltage of one of the source and the drain of the selection transistor HNMT1 (i.e., the gate (the node N1) of the anti-fuse storage element 100) of each of the n memory cells connected to the first word line WLx is raised from the lower voltage source voltage (ground potential) VSS up to the higher voltage source voltage VDD. Thus, the precharge of the anti-fuse storage elements 100 of the n memory cells connected to the first word line WLx is executed (step S2).

Then, at a time T31, the voltage of the first word line WLx is lowered from the higher voltage source voltage VDD down to the lower voltage source voltage (ground potential) VSS, so that the first word line WLx is deactivated. The anti-fuse storage elements 100 of the n memory cells connected to the first word line WLx are kept in the precharged state (step S3).

Next, the anti-fuse storage elements 100 in the memory cells for the second and the subsequent word lines WLx are likewise set up to be in a precharged state. The voltage of the ultimate, that is, the mth word line WLx is raised from the lower voltage source voltage (ground potential) VSS up to the higher voltage source voltage VDD. When the voltage of the ultimate, that is, the mth word line WLx reaches the higher voltage source voltage VDD (i.e., when the word line WL is activated), the selection transistors HNMT1 of the n memory cells connected to the ultimate, that is, the mth word line WLx are turned ON. Then, the voltage of one of the source and the drain of each of the selection transistors HNMT1 (the gate (node N1) of each anti-fuse storage element 100) of the n memory cells connected to the ultimate, that is, the mth word line WLx is raised from the lower voltage source voltage (ground potential) VSS up to the higher voltage source voltage VDD. Thus, the precharge of the anti-fuse storage elements 100 of the n memory cells connected to the ultimate, that is, the mth word line WLx is executed (step S14).

Subsequently, once the setting-up of the precharge operation is finished for all the memory cells 1 (i.e., all the (m×n) memory cells 1), the writing of data into the memory cells 1 of the writing target is executed (the writing of data is executed following similar procedures to those described in steps S4 to S6 of the first embodiment).

Here, the anti-fuse storage elements 100 of all the (m×n) memory cells 1 are set up to be in the precharged state before the execution of the writing of data into the anti-fuse storage elements 100 of the memory cells 1 of the writing target. Accordingly, during the write operation, no large potential difference occurs between the two ends of the anti-fuse storage element 100 (the potential difference between the node N2 and the node N1) of each memory cell that is the non-writing target. Consequently, erroneous writing can be prevented from occurring in the anti-fuse storage element 100 of each memory cell 1 that is the non-writing target. To put it briefly the write-disturb fault can be prevented from occurring.

As has been described thus far, the nonvolatile semiconductor memory device, which the second embodiment of the invention provides together with its programming method, includes the memory cell array 40, the precharge control circuit 2a, the power supply circuit 3, the bit line control circuit 4, the word line control circuit 5, the plural bit line drivers DRBL, the plural word line drivers DRWL, the plural multiplexers 103a, and the plural multiplexers 103b. The memory cell array 40 of the nonvolatile semiconductor memory device 51 includes (m×n) memory cells 1 arranged in a matrix in which m memory cells 1 are arranged in the word line WL direction and n memory cells 1 are arranged in the bit line BL direction. Each memory cell 1 includes the anti-fuse storage element 100 and the selection transistor HNMT1. The precharge control circuit 2a receives an input of the write enable signal Swe, and generates the plural bit line control signals Scblx, the plural word line control signals Scwlx, the multiplexer control signal Scmux, and the write permission signal Swp. Before the data are written into the anti-fuse storage element 100 of each memory cell 1, the anti-fuse storage elements 100 of the (m×n) memory cells 1 are set up in the precharged state by the precharge control circuit 2a, the bit line driver DRBL, the word line driver DRWL, the multiplexers 103a, and the multiplexers 103b. After the anti-fuse storage element of each memory cell, which is either the writing target or the non-writing target, is set up in the precharged state, the power supply circuit 3 outputs the write signal Swd that has a higher potential than the higher voltage source voltage VDD, and the write signal Swd is supplied to the anti-fuse storage elements 100 of the (m×n) memory cells 1.

Accordingly, during the write operation, no large potential difference occurs between the two ends of the anti-fuse storage element 100 of each memory cell that is the non-writing target. Consequently, the write-disturb fault can be prevented from occurring. In addition, each memory cell 1 includes the anti-fuse storage element 100 and the selection transistor HNMT1, and thus the number of elements and the number of signals in the memory cell 1 are reduced significantly. Accordingly, even if the nonvolatile semiconductor memory device 51 is highly integrated, the increase in the area occupied by the memory cells can be reduced significantly.

Note that, in the second embodiment, the anti-fuse storage elements 100 of the n memory cells connected to each word line WLx are precharged simultaneously. Alternatively, the (m×n) memory cells 1 may be precharged sequentially.

Figure 8:
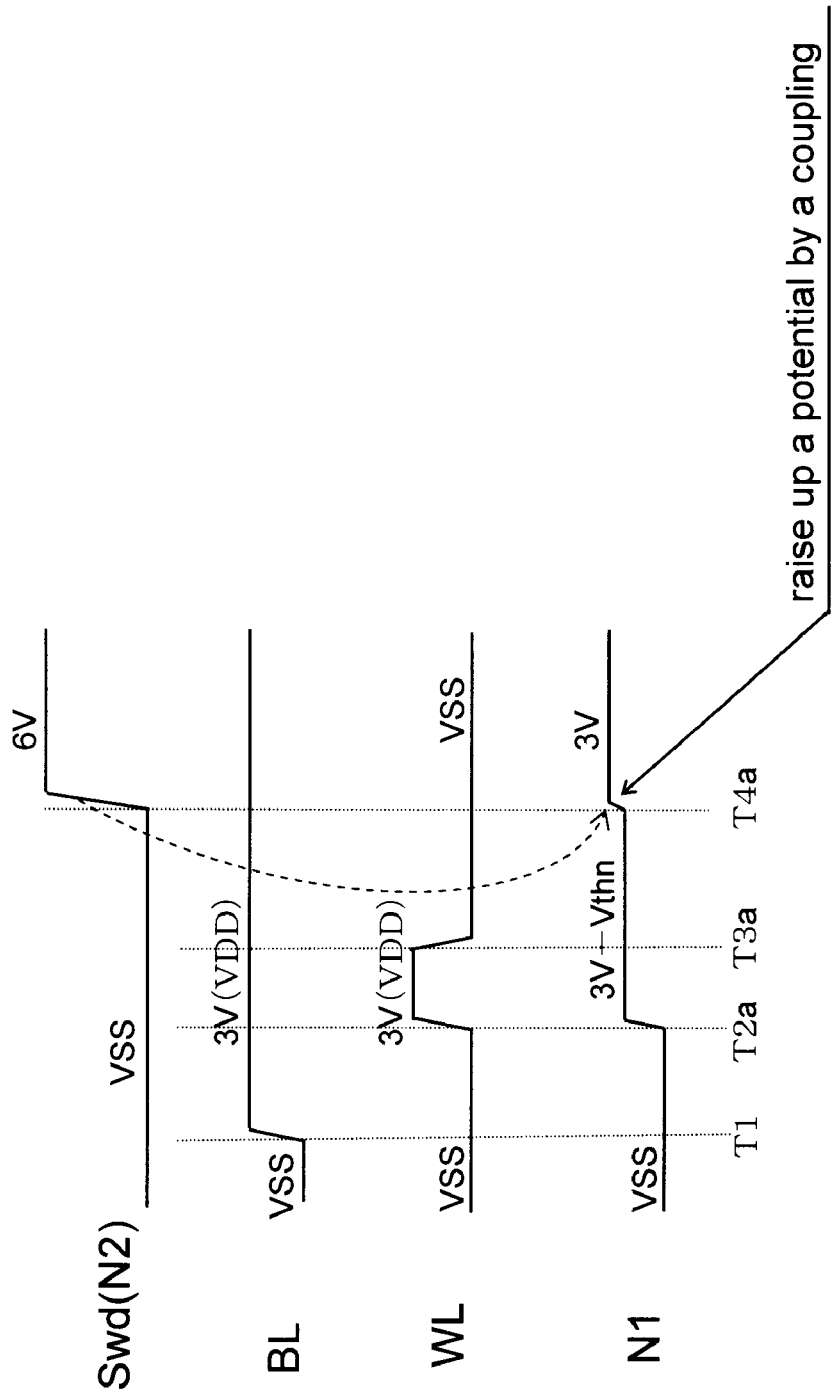
FIG. 8 is a timing chart illustrating the precharge operation and the write operation of the nonvolatile semiconductor memory device according to a third embodiment of the invention.

A nonvolatile semiconductor memory device and its programming method according to a third embodiment of the invention will be described below by referring to the drawings. FIG. 8 is a timing chart illustrating a precharge operation of the nonvolatile semiconductor memory device. The nonvolatile semiconductor memory device of the third embodiment has a similar configuration to the configuration of the nonvolatile semiconductor memory device of the first embodiment. In addition, the selective transistor of each memory cell of the third embodiment has a threshold voltage Vthn that is higher than the corresponding voltage of the first embodiment.

FIG. 8 show that in the nonvolatile semiconductor memory device of the third embodiment, the write signal Swd, the bit line BL, and the word line WL are set at the lower voltage source voltage (ground potential) VSS before the precharge operation is executed.

Next, at a time T1, the voltage of the bit line BL is raised from the lower voltage source voltage (ground potential) VSS up to the higher voltage source voltage VDD, for example, up to 3V.

Subsequently, at a time T2a, the voltage of the word line WL is raised from the lower voltage source voltage (ground potential) VSS up to the higher voltage source voltage VDD, which is, for example, 3V. When the voltage of the word line WL reaches the higher voltage source voltage VDD (i.e., when the word line WL is activated), the selection transistor HNMT1 is turned ON. The voltage of one of the source and the drain of the selection transistor HNMT1 (i.e., the gate (the node N1) of the anti-fuse storage element 100) is raised from the lower voltage source voltage (ground potential) VSS up to the higher voltage source voltage VDD. Thus, the precharge of the anti-fuse storage element 100 is executed. Here, the threshold voltage Vthn of the selection transistor HNMT1 is set at a value that is higher than the corresponding voltage of the first embodiment. Accordingly, the potential of one of the source and the drain of the selection transistor HNMT1 (the gate (node N1) of the anti-fuse storage element 100) is set at (3V−Vthn).

Then, at a time T3a, the voltage of the word line WL is lowered from the higher voltage source voltage VDD down to the lower voltage source voltage (ground potential) VSS, so that the word line WL is deactivated. The anti-fuse storage element 100 is kept in the precharged state.

Next, at a time T4a, the voltage of the write signal Swd is raised from the lower voltage source voltage (ground potential) VSS up to a voltage that is higher than the higher voltage source voltage VDD (3V); for example, the voltage of the write signal Swd may be raised up to 6V (application of the voltage for writing). Here, the potential of one of the source and the drain of the selection transistor HNMT1 (the gate (node N1) of the anti-fuse storage element 100) is raised up to approximately 3V because a rise of potential is caused by a coupling that is caused by the write signal Swd of 6 V. To put it briefly, irrespective of how high the threshold voltage Vthn of the selection transistor HNMT1 is, the potential of one of the source and the drain of the selection transistor HNMT1 (the gate (node N1) of the anti-fuse storage element 100) can be set at the higher voltage source voltage VDD before the execution of the writing.

As has been described thus far, the nonvolatile semiconductor memory device, which the third embodiment of the invention provides together with its programming method, includes the memory cell 1, the precharge control circuit 2, the power supply circuit 3, the bit line driver DRBL, the word line driver DRWL, the multiplexer 103a, and the multiplexer 103b. The memory cell 1 includes the anti-fuse storage element 100 and the selection transistor HNMT1 that has the high threshold voltage Vthn. Before the data is written into the anti-fuse storage element 100 of the memory cell 1, the potential of the gate (node N1) of the anti-fuse storage element 100 is set at (3V−Vthn) by the precharge control circuit 2, the bit line driver DRBL, the word line driver DRWL, the multiplexer 103a, and the multiplexer 103b. Thus, the anti-fuse storage element 100 is set to be in the precharged state. When a voltage that is higher than the higher voltage source voltage VDD is applied to the node N2 of the anti-fuse storage element 100, the potential of the gate (node N1) of the anti-fuse storage element 100 is raised up to approximately 3 V by the coupling.

Accordingly, during the write operation, no large potential difference occurs between the two ends of the anti-fuse storage element 100 of each memory cell that is the non-writing target. Consequently, the write-disturb fault can be prevented from occurring. In addition, each memory cell 1 includes the anti-fuse storage element 100 and the selection transistor HNMT1, and thus the number of elements and the number of signals in the memory cell 1 are reduced significantly. Accordingly, even if the nonvolatile semiconductor memory device 50 is highly integrated, the increase in the area occupied by the memory cell can be reduced significantly.

The above-described embodiments are not the only forms of carrying out the invention. Various modifications may be made without departing from the scope of the invention.

For example, in the above-described embodiments, P-channel MOS transistors are used as the anti-fuse storage elements, and N-channel MOS transistors are used as the selection transistors. Alternatively, N-channel MOS transistors may be used as the anti-fuse storage elements, and P-channel MOS transistors may be used as the selection transistors. In this case, it is preferable that the setting of the potentials of the node N1, the node N2, the bit line BL, the word line WL should be changed.

What is claimed is:

1. A nonvolatile semiconductor memory device comprising:
   a memory cell including an anti-fuse storage element and a selection transistor, a first terminal of the selection transistor being connected to one end of the anti-fuse storage element, a control terminal of the selection transistor being connected to a word line, and a second terminal of the selection transistor being connected to a bit line;
   a precharge control circuit to receive an input of a write enable signal and to generate a bit line control signal, a word line control signal, a write permission signal and a first control signal in response to the write enable signal;
   a power supply circuit to receive an input of the write permission signal and to supply a write voltage to the other end of the anti-fuse element in response to the write permission signal;
   a bit line potential control unit to receive inputs of an address control signal, the bit line control signal and the first control signal, and to control the potential of the bit line in response to the address control signal, the bit line control signal and the first control signal; and
   a word line potential control unit to receive inputs of the address control signal, the word line control signal and the first control signal, and to control the potential of the word line in response to the address control signal, the word line control signal and the first control signal, wherein
   before a write operation of the anti-fuse storage element is executed, the potential of the one end of the anti-fuse storage element is raised, so that the anti-fuse storage element is set to be in a precharged state.

2. The nonvolatile semiconductor memory device according to claim 1, wherein
   the precharge circuit includes:
   a first delay unit to receive an input of the write enable signal and to output the bit line control signal obtained by delaying the write enable signal by a first delay time;
   a second delay unit to receive an input of the bit line control signal and to output a first delay signal obtained by delaying the bit line control signal by a second delay time;
   a third delay unit to receive an input of the first delay signal and to output a second delay signal obtained by delaying the first delay signal by a third delay time;
   a fourth delay unit to receive an input of the second delay signal and to output the write permission signal obtained by delaying the second delay signal by a fourth delay time;
   a first two-input AND circuit to receive inputs of the first delay signal and the second delay signal, and to output the word line control signal obtained by a logical operation on the first delay signal and the second delay signal; and
   a second two-input AND circuit to receive inputs of the write enable signal and the write permission signal, and to output the first control signal obtained by a logical operation on the write enable signal and the write permission signal.

3. The nonvolatile semiconductor memory device according to claim 2, wherein
   each of the first to the fourth delay units is configured of inverters in an even number of stages or buffers in a plurality of stages.

4. The nonvolatile semiconductor memory device according to claim 1, wherein
   the anti-fuse storage element is a P-channel insulated gate field effect transistor including:
   a source, a drain and a body all of the P-channel insulated gate field effect transistor being connected to the power supply circuit, and
   a gate of the P-channel insulated gate field effect transistor being connected to the first terminal of the selection transistor.

5. The nonvolatile semiconductor memory device according to claim 1, wherein
   the selection transistor has a higher breakdown voltage than each of transistors included in the precharge control circuit, the bit line potential control unit and the word line potential control unit.

6. The nonvolatile semiconductor memory device according to claim 5, wherein
   the selection transistor is an N-channel insulated gate field effect transistor.

7. The nonvolatile semiconductor memory device according to claim 1, wherein
   the bit line potential control unit includes:
   a first multiplexer to receive inputs of the bit line control signal and the address control signal, and to output, selectively, any of the bit line control signal and the address control signal in response to the first control signal; and
   a bit line driver to receive an input of a first output signal outputted from the first multiplexer and to drive and output the first output signal to the bit line.

8. The nonvolatile semiconductor memory device according to claim 1, wherein
   the word line potential control unit includes:
   a second multiplexer to receive inputs of the word line control signal and the address control signal, and to output, selectively, any of the word line control signal and the address control signal in response to the first control signal; and
   a word line driver to receive an input of a second output signal outputted from the second multiplexer and to drive and output the second output signal to the word line.

9. A nonvolatile semiconductor memory device comprising:
   a memory cell array including a plurality of memory cells arranged in a matrix form, each memory cell including an anti-fuse storage element and a selection transistor, a first terminal of the selection transistor being connected to one end of the anti-fuse storage element, a control terminal of the selection transistor being connected to a word line, and a second terminal of the selection transistor being connected to a bit line;
   a precharge control circuit to receive an input of a write enable signal and to generate a bit line control signal, a word line control signal, a write permission signal and a first control signal in response to the write enable signal;
   a power supply circuit to receive an input of the write permission signal and to supply a write voltage to the other end of the anti-fuse element in response to the write permission signal;
   a bit line potential control unit to receive inputs of a first address control signal outputted from a bit line control circuit, the bit line control signal and the first control signal, and to control the potential of the bit line in response to the first address control signal, the bit line control signal and the first control signal; and
   a word line potential control unit to receive inputs of a second address control signal outputted from a word line control circuit, the word line control signal and the first control signal, and to control the potential of the word line in response to the second address control signal, the word line control signal and the first control signal, wherein before a write operation of the anti-fuse storage element is executed, the potential of the one end of the anti-fuse storage element is raised, so that the anti-fuse storage element is set to be in a precharged state.

10. A method of programming a nonvolatile semiconductor memory device including: a memory cell having an anti-fuse storage element and a selection transistor, a power supply circuit, a bit line potential control unit and a word line potential control unit, a first terminal of the selection transistor being connected to one end of the anti-fuse storage element, a control terminal of the selection transistor being connected to a word line, and a second terminal of the selection transistor being connected to a bit line, the method comprising:

setting the bit line at a first high potential by the bit line potential control unit;

raising the potential of the word line up to a second high potential by the word line potential control unit so as to activate the word line, to set the anti-fuse storage element in a precharged state;

lowering the potential of the word line by the word line potential control unit so as to deactivate the word line, to keep the precharged state of the anti-fuse storage element; and supplying a write voltage outputted from the power supply circuit to the other end of the anti-fuse storage element after the deactivation of the word line, so that data is written into the anti-fuse storage element.

11. The method of programming the nonvolatile semiconductor memory device according to claim 10, further comprising the step of:

lowering the potential of the word line by the word line potential control unit after the writing of the data into the anti-fuse storage element, and then stopping the supply of the writing voltage to the other end of the anti-fuse storage element.

12. The method of programming the nonvolatile semiconductor memory device according to claim 10, wherein when data is written into the anti-fuse storage element, a dielectric breakdown of the anti-fuse storage element is caused by the write voltage outputted from the power supply circuit, so that data having a value "1" is written into the memory cell.

13. The method of programming the nonvolatile semiconductor memory device according to claim 10, wherein when data is written into the anti-fuse storage element, the write voltage is firstly supplied to the other end of the anti-fuse storage element, then the potential of the bit line is lowered, and then the potential of the word line is raised up to the second high potential so as to write data into the anti-fuse storage element.

14. The method of programming the nonvolatile semiconductor memory device according to claim 10, wherein when data is written into the anti-fuse storage element, the potential of the one end of the anti-fuse storage element is raised up to the first high potential by a coupling, and then the data is written into the anti-fuse storage element.

* * * * *